(12) United States Patent
Kean et al.

(10) Patent No.: US 7,151,382 B1
(45) Date of Patent: Dec. 19, 2006

(54) APPARATUS AND METHOD FOR RADIO FREQUENCY POWER AND STANDING WAVE RATIO MEASUREMENT

(75) Inventors: Timothy L. Kean, Cedar Rapids, IA (US); David L. Krett, Cedar Rapids, IA (US); Ted J. Hoffman, Hiawatha, IA (US); Edward J. Anthony, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 11/232,806

(22) Filed: Sep. 22, 2005

(51) Int. Cl.
*G01R 27/26* (2006.01)

(52) U.S. Cl. ...................... 324/683; 324/645

(58) Field of Classification Search .............. None
See application file for complete search history.

(56) References Cited

U.S. PATENT DOCUMENTS

| 5,206,600 A * | 4/1993 | Moehlmann ............... 324/650 |
| 2002/0047009 A1* | 4/2002 | Flugstad et al. ........... 219/771 |

\* cited by examiner

*Primary Examiner*—Vincent Q. Nguyen
(74) *Attorney, Agent, or Firm*—Nathan O. Jensen; Kyle Eppele

(57) ABSTRACT

A magnitude of radio frequency voltage and current, input into a load from a radio frequency power source, are measured at a single point along a transmission line. Phase difference between voltage and current is also measured. These measurements are used to compute VSWR and forward input power. The computed measurements may be compared against predetermined VSWR limits, and operation of the radio frequency power source can be adjusted to prevent damage to the detection apparatus or load.

20 Claims, 5 Drawing Sheets

APPARATUS AND METHOD FOR RADIO FREQUENCY POWER AND STANDING WAVE RATIO MEASUREMENT

FIELD OF THE INVENTION

The present invention relates to the calculation of radio frequency (RF) power and standing wave ratio through the measurement of a phase and a magnitude of current and voltage at a single, common point along a transmission line from a power source to a load.

BACKGROUND

Radio frequency power sources generally should be impedance matched to load (or antenna) impedance for optimum power transfer to the load. Failure to match source and load impedances can not only result in waste of energy, but can result in excessive heating and possible damage to components in the source or damage to the load. Impedance matching is often achieved by measuring a Voltage (or current) Standing Wave Ratio (VSWR) at a point in a transmission line between source and load. An impedance matching network is then adjusted to optimize the VSWR. Of note, a radio frequency power source may be disabled when the VSWR exceeds limits.

Referring for a moment to FIG. 1, a simplified schematic of a conventional power coupler well known in the art is presented. As can be seen in FIG. 1, cross-coupled transformers 100, 102 are used for the directional coupler. In this model, power is sensed in both the forward and reverse directions on the main sampled line. Samples of forward and reverse power are rectified and filtered to provide dc analogs of the detected signals. The dc analogs are then used to calculate power and VSWR.

Limitations of the directional coupler of FIG. 1 include the requirement to acquire two samples of power to calculate VSWR, as well as associated bandwidth limitations. Further, measuring both forward and reverse power requires directional power couplers that can be bulky, dissipate some power, and can be difficult to optimize across wide frequency ranges. These directional power couplers may introduce nonlinearities which can produce undesirable harmonics. Many methods disclosed above produce significant distortion due to the use of certain transformers.

Hence, there is a need for an apparatus and method for determining power and VSWR in the transmission line of a RF source that overcomes one or more of the drawbacks identified above.

SUMMARY

The apparatus and method for determining a power and a standing wave ratio of an input signal herein disclosed advances the art and overcomes problems articulated above by providing a more efficient, more compact apparatus and corresponding method wherein voltage and current are measured at a single point along a transmission line.

In particular, and by way of example only, in one embodiment a method of determining a power and a standing wave ratio in an input signal delivered to a load is provided including: sampling an amplitude of voltage at a point in a transmission line; sampling an amplitude of current at substantially the same point in the transmission line; determining a phase difference between the voltage and the current; and calculating a power and a standing wave ratio delivered to the load.

In yet another embodiment, an apparatus for determining a power and a standing wave ratio is provided including: a means for sampling a voltage of a radio frequency input signal at a point in a transmission line; a means for sampling a current of the radio frequency input signal at substantially the same point in the transmission line; a means for determining a phase difference between the voltage and the current of the radio frequency input signal; and, a means for calculating a power and a standing wave ratio from voltage, current and phase difference.

In still another embodiment, a system for controlling a radio frequency signal input into a load is provided, including: a means for sampling a voltage of the radio frequency signal at a point in a transmission line; a means for sampling a current of the radio frequency signal at substantially the same point in the transmission line; a means for determining a phase difference between the voltage and the current of the radio frequency signal; a means for applying one or more algorithms to calculate a power and a standing wave ratio using voltage, current and phase difference; and a means for modifying the input signal based on a standing wave ratio calculation.

DETAILED DESCRIPTION

Before proceeding with the detailed description, it should be noted that the present teaching is by way of example, not by limitation. The concepts herein are not limited to use or application with one specific type of apparatus for determining a power and a standing wave ratio ("VSWR"). Thus, although the instrumentalities described herein are for the convenience of explanation, shown and described with respect to exemplary embodiments, the principles herein may be equally applied in other types of apparatuses for determining a power and a VSWR.

Figure 2:
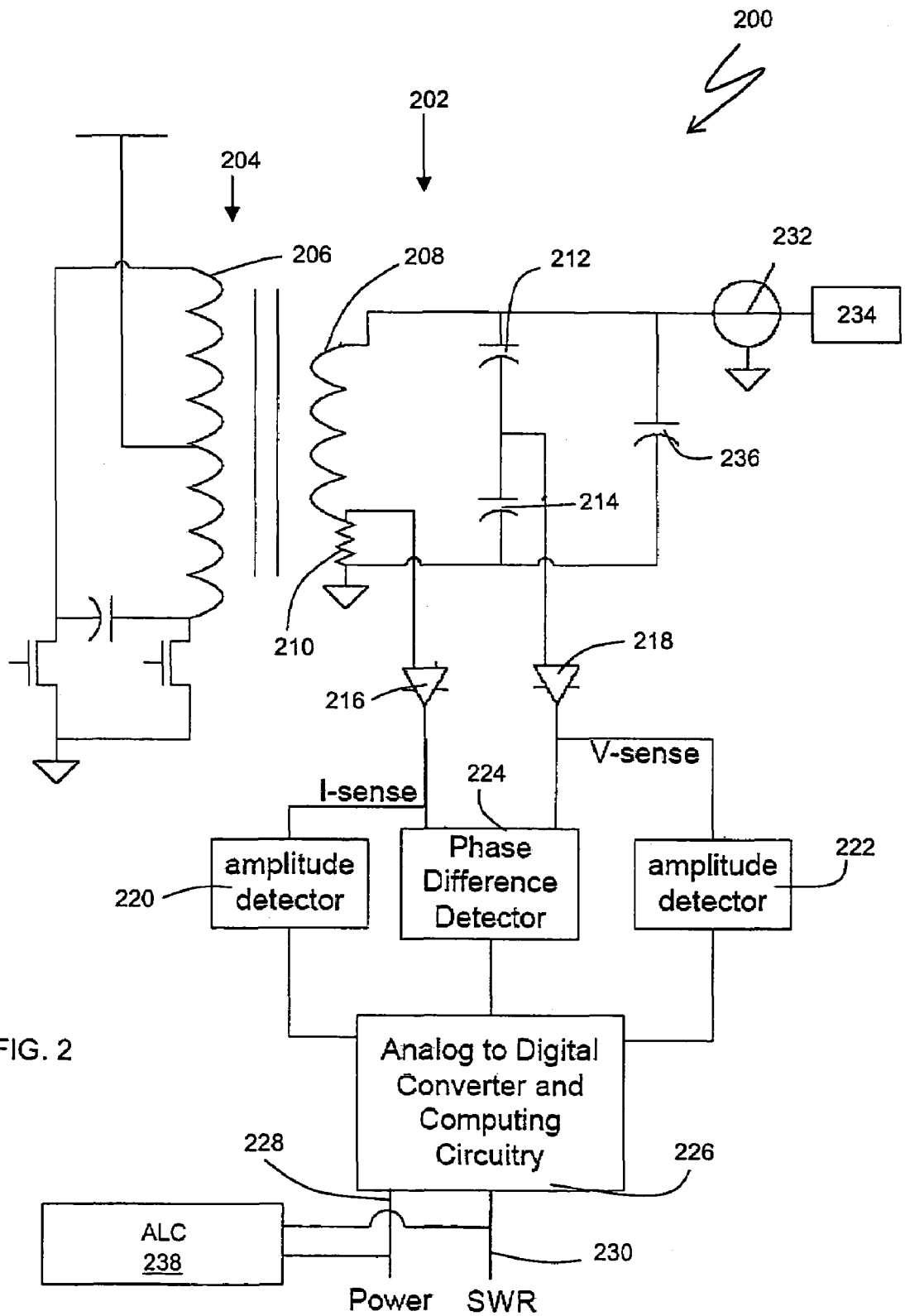
FIG. 2 is a partial schematic and partial block diagram of an apparatus for determining a power and a standing wave ratio, wherein current is sensed at an output transformer, according to an embodiment.

FIG. 2 illustrates an apparatus 200 for determining a power and a VSWR of an input signal directed along a transmission line to a load, according to an embodiment. Of note, the input signal is preferably a sinusoidal signal. A RF power amplifier 202 includes a transformer 204 having a primary winding 206 and a secondary winding 208. A small value current-sense resistor 210 is in series with a ground end of secondary winding 208 to measure or sample a current of the input signal. In at least one embodiment, current is sampled across parallel resistors in a return path of the transmission line. A voltage-divider capacitor 212 and a voltage-divider capacitor 214 provide a voltage sample or measurement. The current and voltage samples are taken at a single, substantially the same point in a transmission line of the input signal. The current sample is buffered by an amplifier 216, and the voltage sample is buffered by an amplifier 218 to produce current and voltage sense signals respectively.

An amplitude detector 220 monitors an amplitude of the current sense signal, an amplitude detector 222 monitors an amplitude of the voltage sense signals, and a phase difference detector 224 monitors a difference in phase between the current I-Sense and voltage V-Sense signals. Outputs from all three detectors 220, 222, 224 are input into an analog-to-digital converter and computing circuitry 226, wherein the outputs are digitized and processed. Processing may occur using a microprocessor, field programmable gate array ("FPGA"), or other device well known in the art, and may include algorithms specifically designed to calculate the parameters (power, VSWR) of interest. The outputs of computing circuitry 226 are a power signal 228 and a VSWR signal 230. These outputs may be used to control the input signal or other means to adjust power amplifier output power. Control may include use of a look-up table to compare calculated values to established, acceptable values for power and VSWR. The amplifier 202 outputs are coupled through a coaxial connector 232 to a load 234, which may be an antenna, and an additional capacitor 236 provides for any necessary tuning of the input circuit.

An automatic level control ("ALC") 238 may be included in apparatus 200. The ALC 238 adjusts the drive signals in power amplifier 202 via a feedback signal to either an exciter (not shown) or variable attenuator (not shown) within power amplifier 202 to regulate output power. In addition, the ALC is used to prevent damage to power amplifier 202 components and/or the load 234 under high VSWR, overtemperture, or other hazardous conditions.

Figure 3:
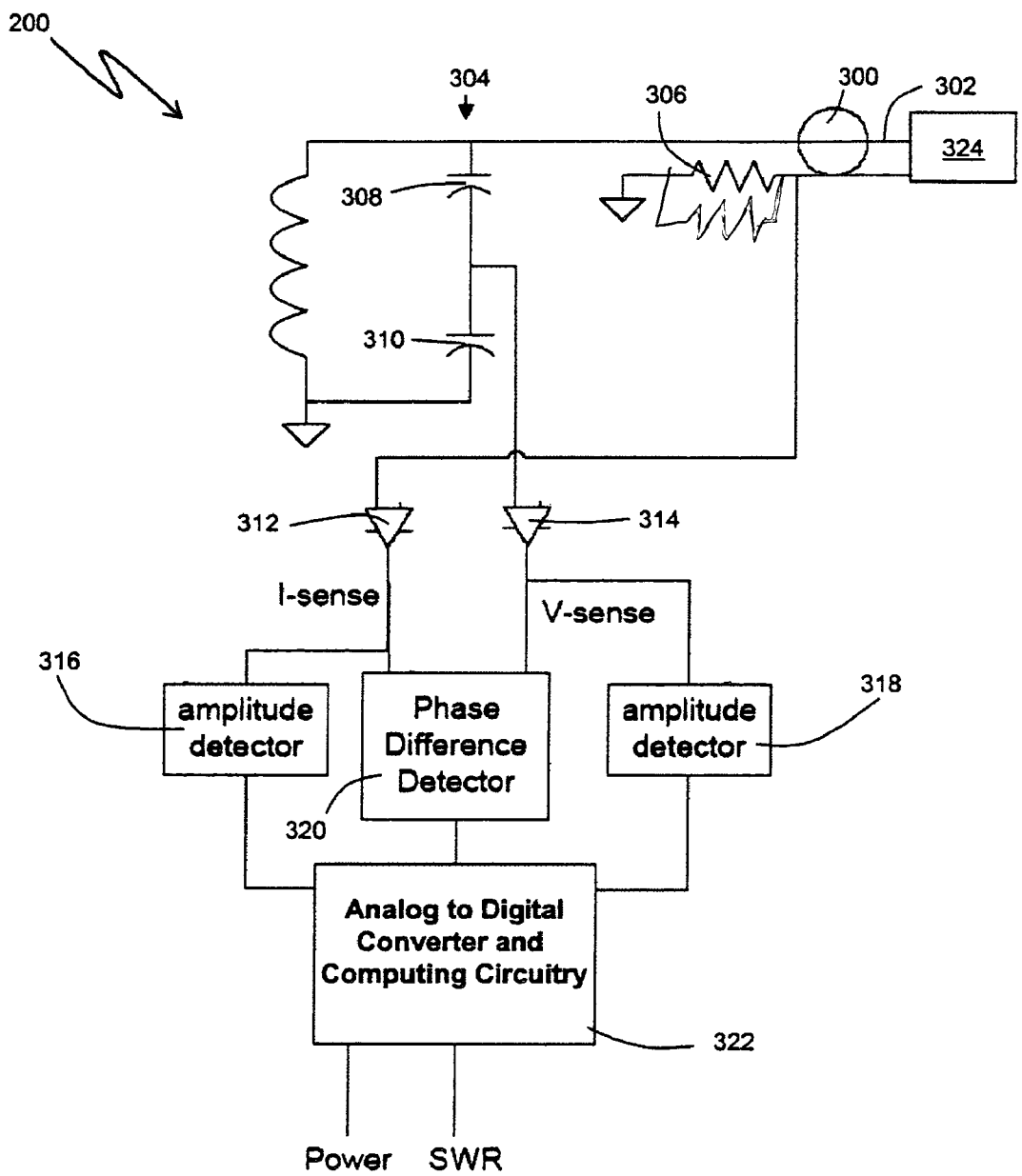
FIG. 3 is a partial schematic and partial block diagram of an apparatus for determining a power and a standing wave ratio, wherein current is sensed in the shield of a coaxial transmission line, according to an embodiment.

Referring now to FIG. 3, an alternative embodiment is presented that senses current at a balun 300 of a coaxial output connector 302 of an RF power amplifier 304. Coaxial output connectors are one form of connection between a device and a transmission line or an antenna (load). A small value current-sense resistor 306 is in series with the balun 300 and ground to provide a current sample. A voltage-divider capacitor 308 and a voltage-divider capacitor 310 provide a voltage sample. The current sample is buffered by an amplifier 312, and the voltage sample is buffered by an amplifier 314 to produce current I-Sense and voltage V-Sense signals respectively. An amplitude detector 316 monitors an amplitude of the current sense signal, an amplitude detector 318 monitors an amplitude of the voltage sense signals, and a phase difference detector 320 monitors a difference in phase between the current sense and voltage sense signals. The outputs of all three detectors 316, 318, 320 are input into an analog-to-digital converter and computing circuitry 322, wherein the outputs are digitized and processed by a microprocessor, FPGA or other processing device. Computing circuitry 322 produces power and VSWR signals which may be monitored and modified to ensure linear operation of power amplifier 304, and to ensure acceptable input signals into a load.

Figure 4:
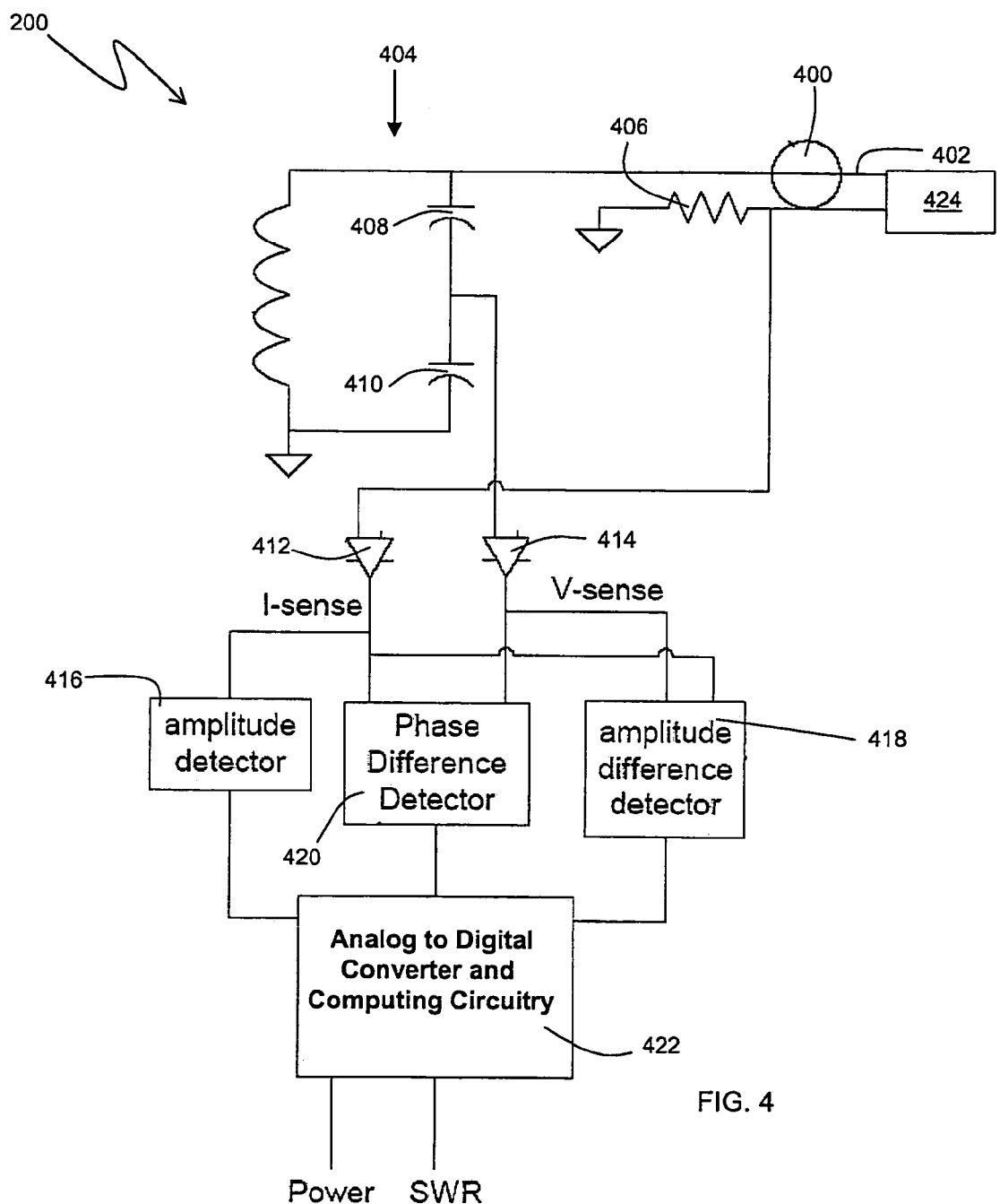
FIG. 4 is a partial schematic and partial block diagram of an apparatus for determining a power and a standing wave ratio using a magnitude differential detector, according to an embodiment.

FIG. 4 illustrates yet another embodiment that senses current at a balun 400 of a coaxial output connector 402 of an RF power amplifier 404. A small value current-sense resistor 406 is in series with the balun 400 and ground to provide a current sample. A voltage-divider capacitor 408 and a voltage-divider capacitor 410 provide a voltage sample. The current sample is buffered by an amplifier 412, and the voltage sample is buffered by an amplifier 414 to produce current I-Sense and voltage V-Sense signals respectively. An amplitude detector 416 monitors an amplitude of the current sense signal, an amplitude difference detector 418 monitors a difference between an amplitude of the voltage and current sense signals, and a phase difference detector 420 monitors a difference in phase between the current and voltage sense signals. Outputs from all three detectors 416, 418, 420 are input into an analog-to-digital converter and computing circuitry 422, wherein the outputs are digitized and processed by a microprocessor, FPGA, or other processing device. Computing circuitry 422 produces power and VSWR signals which may be monitored to ensure linear operation of power amplifier 404, and to ensure acceptable input signals into a load 424.

Figure 5:
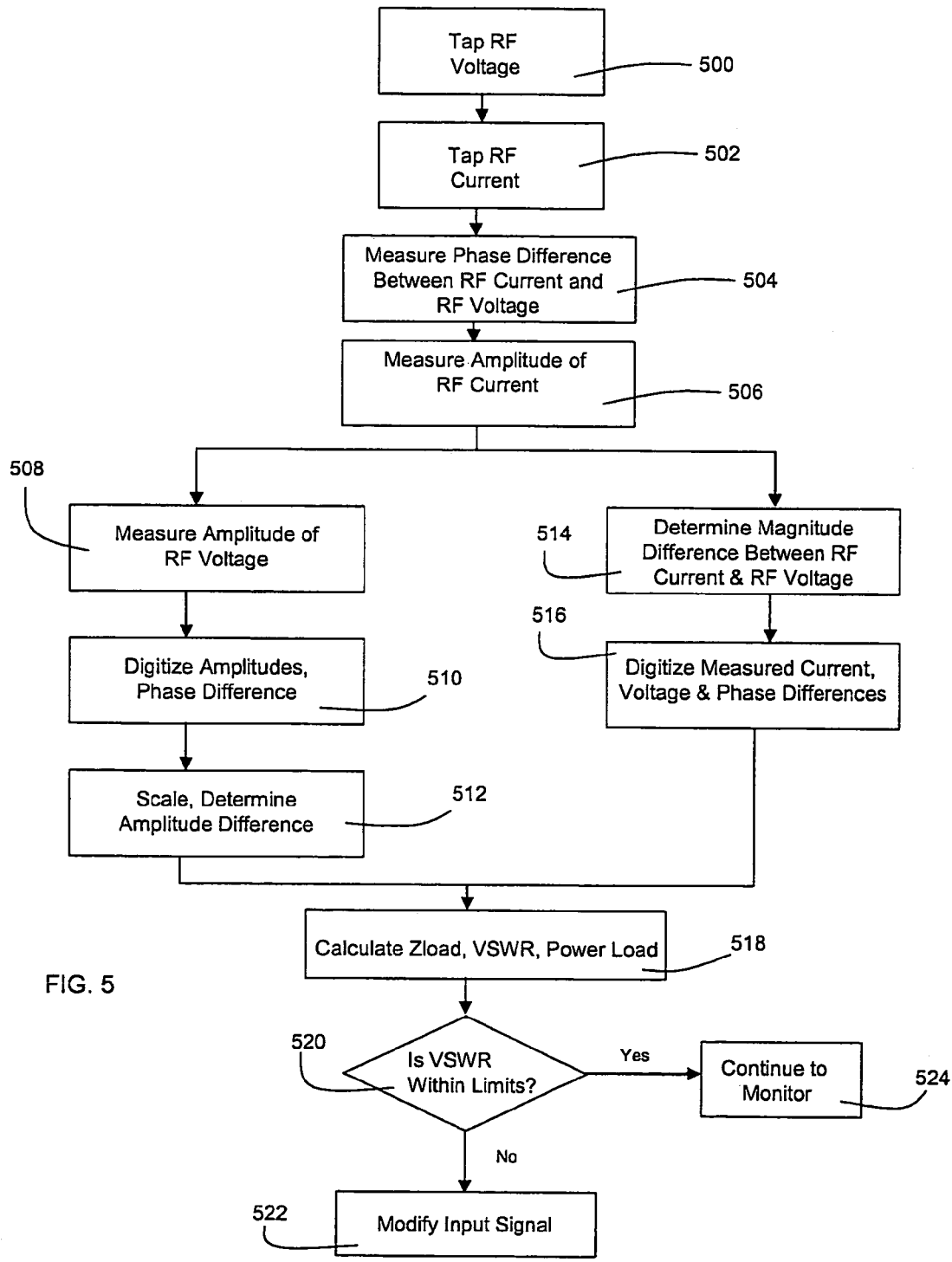
FIG. 5 is a flowchart of a method for determining a power and a standing wave ratio, according to an embodiment.

Considering now the operation of apparatus 200, FIG. 5 is a flowchart illustrating alternative embodiments of a method for determining a power and a standing wave ratio in an input signal delivered to a load. As illustrated in FIG. 2, FIG. 3, and FIG. 4, a RF voltage is tapped or sampled 500 to generate a voltage sense, V-Sense signal. Similarly, a RF current is tapped or sampled 502 to generate a current sense, I-Sense signal. These signals are representative of radio frequency voltage and power at a single point in the RF transmission line of the circuit. The phase difference between the RF current and the RF voltage is detected 504 by a phase difference detector (e.g. detectors 224, 320, 420), and the magnitude of the RF current is measured 506 by an amplitude detector (e.g. detectors 220, 316, 416).

Figure 1:
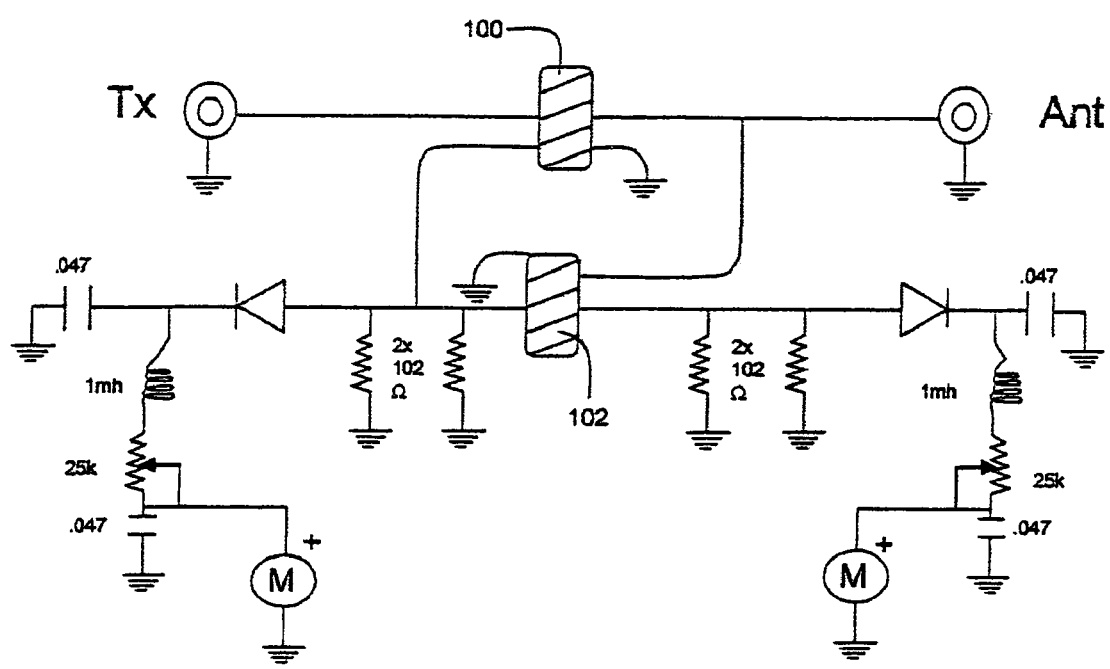
FIG. 1 is a schematic of a conventional power coupler.

In an embodiment, which may use circuitry similar to that of FIG. 1 or FIG. 2, a magnitude of the RF voltage is determined 508 by an amplitude detector (e.g. detectors 222, 318). The current amplitude as measured by amplitude detectors 220, 316, voltage amplitude as determined by amplitude detectors 220, 318, and phase difference as measured by phase difference detectors 224, 320 are digitized 510 by an analog-to-digital converter. The digitized measurements are input into a microprocessor or other digital computing circuitry 226, 322. Any necessary scaling operations are performed, and an amplitude difference is determined 512 by subtraction.

In yet another embodiment, which may use circuitry similar to that of FIG. 3, a difference in magnitude between the RF voltage and RF current is determined 514 by an amplitude difference detector, e.g. 418. The current amplitude as measured by amplitude detector 416, amplitude difference as determined by amplitude difference detector 418, and phase difference as measured by phase difference detector 420 are digitized 516 by an analog-to-digital converter and input to a microprocessor or other digital computing circuitry, e.g. circuitry 422.

Regardless of the approach taken, digital circuitry 226, 322, 422 computes 518 load impedance $Z_L$, assuming a 50-ohm source impedance, by employing the equations:

$$|Z| = \frac{50}{10^{\frac{Is(dB)-Vs(dB)}{20}}} \text{ and } |\theta| = [\theta_{Is} - \theta_{Vs}] + 90°$$

In doing so, the digitized phase difference, VPHS, is adjusted as necessary to compensate for phase errors, such as phase errors that can be induced by circuitry and by any differences between the point at which voltage and current are measured in the RF circuit, before computing the phase angle $\theta$.

$Z_L$ is then used by the computing circuitry to compute VSWR, according to the equations:

$$\Gamma = \frac{Z_L - 50}{Z_L + 50} \quad VSWR = \frac{1 + |\Gamma|}{1 - |\Gamma|}$$

Finally a forward power is computed from the magnitude of current, $i_{pk}$, and $Z_L$ by applying the equation:

$$P_L = \left[\frac{i_{pk}^2}{2}\right] Z_{real}$$

Once VSWR and forward power are computed 518, the VSWR and forward power may be compared 520 to operational limits. If these limits are exceeded, the RF amplifier may be operated in a reduced output power mode or may be shut down 522. If the computed VSWR and power are within limits, operations continue, as does monitoring 524 of input signal parameters (VSWR, power).

Magnitude detectors for voltage and current may be logarithmic or linear, since appropriate compensation can be performed digitally. The equations as shown may require changes of constants when operated at impedances of other than fifty ohms, and scaling factors and circuit gains may be determined for each hardware implementation. Calibration over temperature and frequency can also be easily incorporated with this digital implementation.

While the invention has been particularly shown and described with reference to a preferred embodiment thereof, it will be understood by those skilled in the art that various other changes in the form and details may be made without departing from the spirit and scope of the invention. It is to be understood that various changes may be made in adapting the invention to different embodiments without departing from the broader inventive concepts disclosed herein and comprehended by the claims that follow.

What is claimed is:

1. A method of determining a power and a standing wave ratio in an input signal delivered to a load comprising:
    sampling an amplitude of voltage at a point in a transmission line;
    sampling, using a balun, an amplitude of current at substantially the same point in the transmission line;
    determining a phase difference between the voltage and the current; and
    calculating a power and a standing wave ratio delivered to the load.

2. The method of claim 1, wherein sampling an amplitude of voltage further comprises using one or more capacitive dividers to sample the voltage.

3. The method of claim 1, further comprising sampling the current across parallel resistors in a return path of the transmission line.

4. The method of claim 1, further comprising adjusting the input signal to modify the measured phase difference to compensate for phase errors.

5. The method of claim 1, further comprising:
    comparing the standing wave ratio to an operational limit; and
    altering operation of a radio frequency source if the standing wave ratio exceeds the operational limit.

6. The method of claim 5, further comprising controlling the input signal using an automatic level control feedback loop.

7. The method of claim 1, further comprises comparing calculated values of power and standing wave ratio to established values contained in a look-up table.

8. The method of claim 1, wherein the input signal is a sinusoidal signal.

9. The method of claim 1, wherein the current is measured at a shield connection of a coaxial transmission line.

10. An apparatus for determining a power and a standing wave ratio comprising:
    a means for sampling a voltage of a radio frequency input signal at a point in a transmission line;
    a means for sampling a current of the radio frequency input signal at substantially the same point in the transmission line;
    wherein said means for sampling a current comprises a balun;
    a means for determining a phase difference between the voltage and the current of the radio frequency input signal; and
    a means for calculating a power and a standing wave ratio from voltage, current and phase difference.

11. The apparatus of claim 10, wherein the means for sampling a voltage is one or more capacitive dividers.

12. The apparatus of claim 10, further comprising a means for detecting a voltage amplitude difference.

13. The apparatus of claim 10, wherein the current is sampled at a shield connection of a coaxial transmission line.

14. The apparatus of claim 10, wherein the means for calculating a power and standing wave ratio is selected from a group consisting of: a microprocessor and a field programmable gate array.

15. The apparatus of claim 14, further comprising a look-up table for comparing calculated values of power and standing wave ratio to established values of power and standing wave ratio contained in the look-up table.

16. The apparatus of claim 10, further comprising an automatic level control feedback loop for controlling the input signal.

17. A system for controlling a radio frequency signal input into a load comprising:
    a means for sampling a voltage of the radio frequency signal at a point in a transmission line;
    a means for sampling a current of the radio frequency signal at substantially the same point in the transmission line;
    wherein said means for sampling a current comprises a balun;
    a means for determining a phase difference between the voltage and the current of the radio frequency signal;
    a means for applying one or more algorithms to calculate a power and a standing wave ratio using voltage, current and phase difference; and
    a means for modifying the input signal based on a standing wave ratio calculation.

18. The system of claim 17, wherein the means for modifying power output comprises an automatic level control feedback loop.

19. The system of claim 18, wherein the automatic level control feedback loop further comprises an input signal limiting device selected from a group consisting of: an exciter or a variable attenuator.

20. The system of claim 17, wherein the means for applying one or more algorithms is selected from a group consisting of: a microprocessor or a field programmable gate array.

* * * * *